United States Patent
Kang et al.

(10) Patent No.: US 7,957,212 B2
(45) Date of Patent: Jun. 7, 2011

(54) PSEUDO SRAM

(75) Inventors: Hee-Bok Kang, Kyoungki-do (KR); Jin-Hong Ahn, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 47 days.

(21) Appl. No.: 11/395,897

(22) Filed: Mar. 30, 2006

(65) Prior Publication Data

US 2006/0221746 A1    Oct. 5, 2006

(30) Foreign Application Priority Data

Mar. 31, 2005 (KR) .......................... 10-2005-0027411
Mar. 27, 2006 (KR) .............................. 2006-0027586

(51) Int. Cl.
*G11C 7/00* (2006.01)
(52) U.S. Cl. ........................................ 365/222; 365/154
(58) Field of Classification Search .................. 365/222, 365/154, 149
See application file for complete search history.

(56) References Cited

U.S. PATENT DOCUMENTS

| | | | | |
|---|---|---|---|---|
| 5,075,886 A | * | 12/1991 | Isobe et al. | 365/194 |
| 5,289,424 A | * | 2/1994 | Ito et al. | 365/222 |
| 5,617,551 A | | 4/1997 | Corder | |
| 5,963,497 A | | 10/1999 | Holland | |
| 6,269,041 B1 | | 7/2001 | Wang et al. | |
| 6,801,468 B1 | | 10/2004 | Lee | |
| 6,862,247 B2 | | 3/2005 | Yamazaki | |
| 7,085,186 B2 | * | 8/2006 | Mobley | 365/222 |
| 7,221,574 B2 | * | 5/2007 | Tomita et al. | 365/22 |

FOREIGN PATENT DOCUMENTS

| | | |
|---|---|---|
| JP | 2002-312232 | 10/2002 |
| JP | 2003-059264 | 2/2003 |
| KR | 1020010113517 A | 12/2001 |
| KR | 1020040036556 A | 4/2004 |

* cited by examiner

*Primary Examiner* — Ahn Phung
(74) *Attorney, Agent, or Firm* — Blakely, Sokoloff, Taylor & Zafman LLP

(57) ABSTRACT

A unit memory cell for use in a pseudo static random access memory (SRAM) includes a cell capacitor; a normal accessing transistor whose gate, drain and source are respectively connected to a normal accessing word line, a normal accessing bit line and a storage node of the cell capacitor; and a refresh accessing transistor whose gate, drain and source are respectively connected to a refresh accessing word line, a refresh accessing bit line and the storage node of the cell capacitor.

8 Claims, 10 Drawing Sheets

PSEUDO SRAM

FIELD OF INVENTION

The present invention relates to a semiconductor memory device; and, more particularly, to a pseudo static random access memory.

DESCRIPTION OF PRIOR ART

A random access memory (RAM) is a semiconductor memory device for storing an input data in a memory cell array. Herein, each memory cell has an address to be selected.

Generally, there are two different kinds of the RAM, i.e., one is a static random access memory (SRAM) and the other is a dynamic random access memory (DRAM). A memory cell of the SRAM has a static latching structure so that the data content of the memory cell can be maintained while a power is supplied to the SRAM. Herein, the memory cell of the SRAM includes four or six transistors (generally said to be a 4T or 6T structure).

Meanwhile, a memory cell of the DRAM includes a single transistor and a single capacitor (generally said to be a 1T1C structure). Therefore, a conventional memory cell of the SRAM requires about 10 times larger size than that of the DRAM. Due to the above-mentioned demerit of the SRAM, the DRAM becomes more advantageous over the SRAM in the semiconductor memory device market.

Therefore, for overcoming the above-mentioned problem, a pseudo SRAM has been developed. Even though the pseudo SRAM includes a dynamic cell such as the 1T1C structured cell of the DRAM, an interface of the pseudo SRAM is completely compatible with the SRAM. Therefore, the pseudo SRAM is technically operated as same as the SRAM.

Since the pseudo SRAM includes the dynamic cell, a refresh operation is required. However, since the refresh operation is not needed for the SRAM, a refresh circuit for performing the refresh operation is required for the pseudo SRAM.

At a self refresh mode, a memory cell is periodically refreshed according to a predetermined refresh time period. That is, a refresh request signal is periodically generated by a refresh timing counter circuit included in a chip so that the refresh operation is performed in response to the refresh request signal.

That is, according to a conventional pseudo SRAM, the refresh cycle and a normal cycle are sequentially performed. Therefore, if the refresh cycle is added before the normal cycle, a time for finishing the normal cycle is increased by two times in comparison with the normal cycle without the refresh cycle.

FIG. 1 is a schematic circuit diagram showing a cell array (folded bit line structure) and a sensing circuit of a conventional SRAM.

Referring to FIG. 1, a unit memory cell of the conventional SRAM includes a single n-type metal oxide semiconductor (NMOS) transistor and a single capacitor controlled by a word line, e.g., WL0. A drain of the NMOS transistor is connected to a bit line (BL) and a source of the NMOS transistor is connected to one terminal, i.e., a storage node (SN), of the capacitor.

Meanwhile, the other terminal, i.e., a plate line (PL), of the capacitor is generally connected to a common cell plate and is supplied with a cell plate power supply voltage (VCP). Generally, the cell plate power supply voltage VCP has a half voltage level of a power supply voltage VDD.

Meanwhile, a bit line sense amplifying block (S/A) is connected to a bit line pair, i.e., the bit line BL and a sub bit line /BL. When the word line WL0 is activated, a cell data is transferred to the bit line BL and a reference voltage REF is supplied to the sub bit line /BL. Similarly, when a word line WL2 is activated, a cell data is transferred to the sub bit line /BL and the reference voltage REF is supplied to the bit line BL. A data input/output of the sense amplifier S/A is performed through a differential local data bus LDB and LDBB.

FIG. 2 is a schematic circuit diagram depicting the bit line sense amplifying block S/A shown in FIG. 1.

A bit line sense amplifier (BLSA) can have various structures. However, as shown in FIG. 2, the bit line sense amplifier BLSA generally includes two p-type metal oxide semiconductor (PMOS) transistors connected between a pull-up power supply line (RTO line) and the bit line pair BL and /BL and two NMOS transistors connected between a pull-down power supply line (Sb line) and the bit line pair BL and /BL.

Meanwhile, the bit line sense amplifier BLSA is shared by a cell array 0 block arranged above the bit line sense amplifier BLSA and a cell array 1 block arranged below the bit line sense amplifier BLSA. A bit line separation unit, a bit line equalization unit, a bit line precharge unit and a column selection unit are arranged between the bit line sense amplifier BLSA and a memory cell array.

Between the bit line sense amplifier BLSA and the cell array 0 bock, NMOS transistors M1 and M2 for connecting/disconnecting an upper bit line pair BLU and /BLU to/from the bit line sense amplifier BLSA in response to an upper bit line isolation signal BISH; NMOS transistors M3 and M4 for precharging the bit line pair BL and /BL to a bit line precharge voltage VBLP (generally has a voltage level of VDD/2) in response to a bit line equalizing signal BLEQ; and an NMOS transistor m0 for equalizing the upper bit line pair BLU and /BLU in response to the bit line equalizing signal BLEQ are included.

Similarly, between the bit line sense amplifier BLSA and the cell array 1 bock, NMOS transistors M5 and M6 for connecting/disconnecting a lower bit line pair BLD and /BLD to/from the bit line sense amplifier BLSA in response to a lower bit line isolation signal BISL; an NMOS transistor m7 for equalizing the lower bit line pair BLD and /BLD in response to the bit line equalizing signal BLEQ; and NMOS transistors M8 and M9 for selectively connecting the bit line pair BL and /BL and the differential local data bus LDB and LDBB in response to a column selection signal YI are included.

FIG. 3 is a timing diagram showing an operation of the conventional SRAM shown in FIGS. 1 and 2. Herein, it is assumed that a data '1' is stored in the storage node SN of a memory cell.

At a precharge step (the bit line equalizing signal BLEQ is in a logic high level), the bit line pair BL and /BL and the pull-up and pull-down power supply lines RTO and Sb of the bit line sense amplifying block S/A are precharged to the precharge voltage VBLP.

Thereafter, when a word line WL is activated as a high voltage Vpp in response to an inputted active command, a charge stored in the storage node SN of the memory cell connected to the word line WL is shared by the bit line BL so that a voltage level of the bit line BL is slightly increased (the bit line equalizing signal BLEQ is in a logic low level).

Next, when the bit line sense amplifying block S/A is enabled so that the pull-up and pull-down power supply lines RTO and Sb are supplied with corresponding power supply voltages, the bit line BL and the sub bit line /BL are respectively amplified to the VDD voltage level and a ground voltage level. Herein, the ground voltage is the reference voltage REF.

Thereafter, the amplified voltage levels of the bit line BL and the sub bit line /BL are restored to the storage node SN of the memory cell and the state of the conventional SRAM becomes the precharge step.

FIG. 4 is another timing diagram depicting an operation of the conventional SRAM shown in FIG. 1.

Referring to FIG. 4, if a refresh cycle request signal is activated while a previous (N−1) operating cycle (T0 period) is performed, a refresh cycle (t1) is performed in response to the activated refresh cycle request signal simultaneously with a start of a corresponding operating cycle (N).

Thereafter, after the refresh cycle is completed, an actual access to a memory cell is performed at a normal cycle (t2).

Therefore, for performing one normal cycle, a time of t1+t2 is required. That is, an actual access time $t_{ac}$ is increased by an amount of t1 in comparison with an access time $t_{acwr}$ at the normal cycle excluding the refresh cycle. Accordingly, an operating performance of the conventional SRAM is degraded due to the increase of the read/write cycle time.

SUMMARY OF INVENTION

It is, therefore, an object of the present invention to provide a pseudo SRAM for preventing an increase of an access time due to a refresh operation.

In accordance with an aspect of the present invention, there is provided a unit memory cell for use in a pseudo static random access memory (SRAM), including: a cell capacitor; a normal accessing transistor whose gate, drain and source are respectively connected to a normal accessing word line, a normal accessing bit line and a storage node of the cell capacitor; and a refresh accessing transistor whose gate, drain and source are respectively connected to a refresh accessing word line, a refresh accessing bit line and the storage node of the cell capacitor.

In accordance with another aspect of the present invention, there is provided a pseudo SRAM, including: a memory cell array block where a plurality of normal accessing bit lines and refresh accessing bit lines and a plurality of normal accessing word lines and refresh accessing word lines are arranged in pairs, wherein the memory cell array block includes a unit memory cell, the unit memory cell including: a cell capacitor; a normal accessing transistor for selectively connecting the cell capacitor to the normal accessing bit line under the control of the normal accessing word line; and a refresh accessing transistor for selectively connecting the cell capacitor to the refresh accessing bit lines under the control of the refresh accessing word line; a normal accessing sense amplifier array block which is arranged on one column side of the memory cell array block and is connected to the normal accessing bit line; a refresh accessing sense amplifier array block which is arranged on the other column side of the memory cell array block and is connected to the refresh accessing bit line; a normal accessing local data bus connected to the normal accessing sense amplifier array block; and a refresh accessing local data bus connected to the refresh accessing sense amplifier array block.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a pseudo static random access memory (SRAM) in accordance with the present invention will be described in detail referring to the accompanying drawings.

Figure 1:
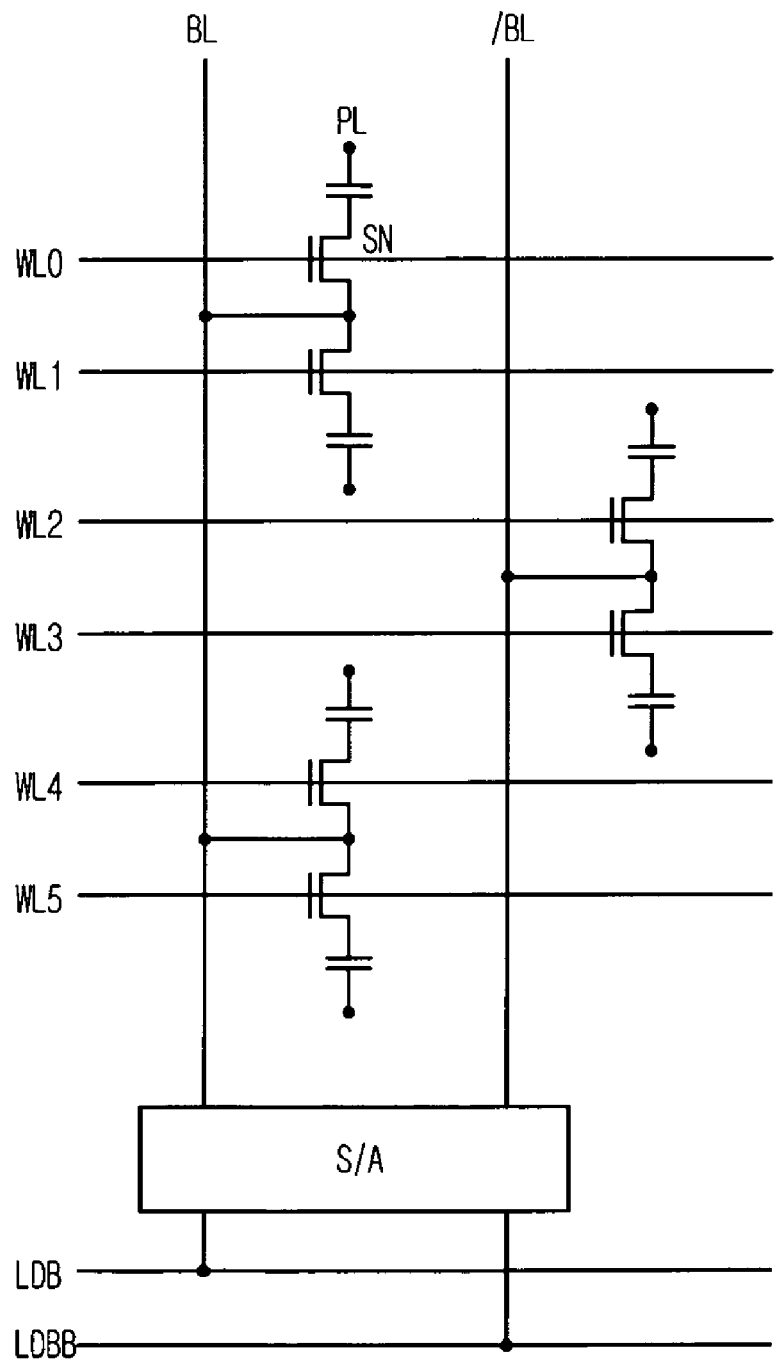
FIG. 1 is a schematic circuit diagram showing a cell array (folded bit line structure) and a sensing circuit of a conventional SRAM.
Figure 2:
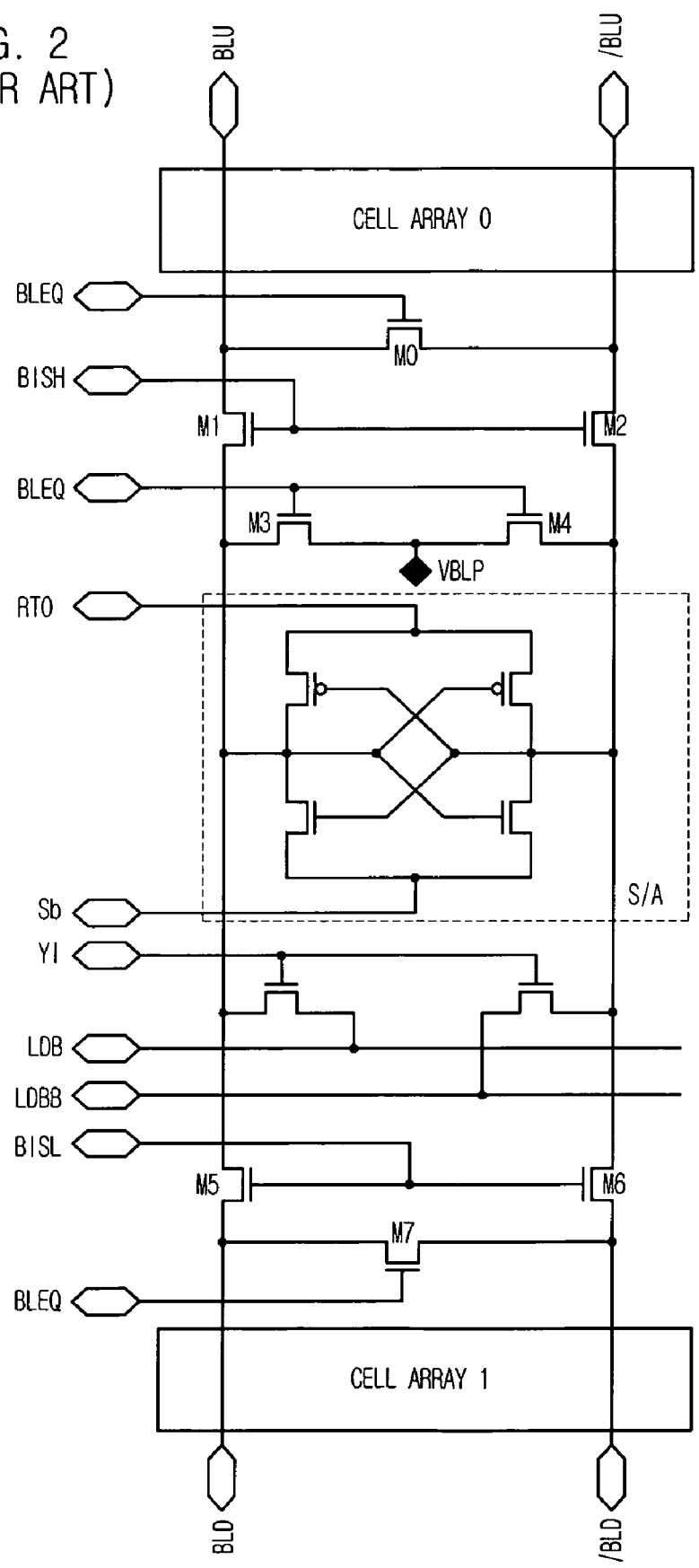
FIG. 2 is a schematic circuit diagram depicting the bit line sense amplifying block shown in FIG. 1.
Figure 3:
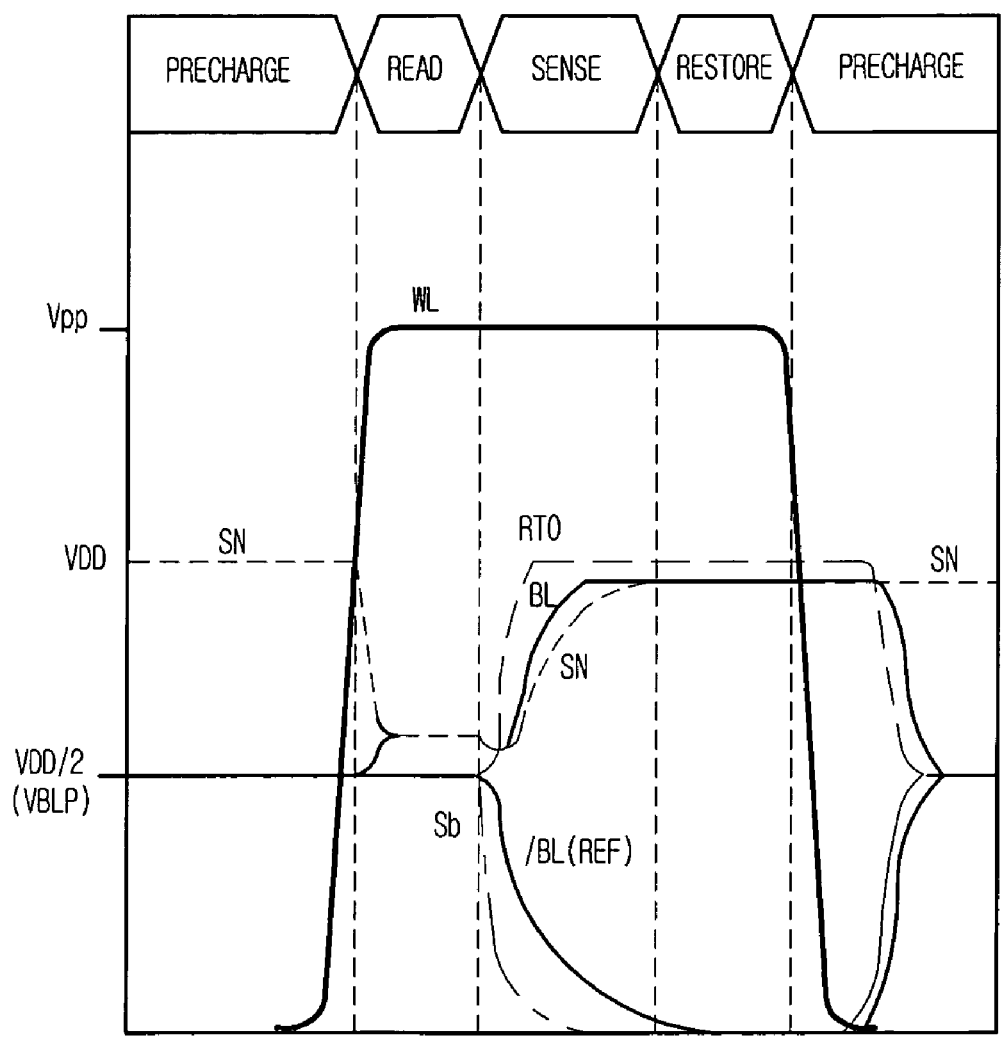
FIG. 3 is a timing diagram showing an operation of the conventional SRAM shown in FIGS. 1 and 2.
Figure 4:
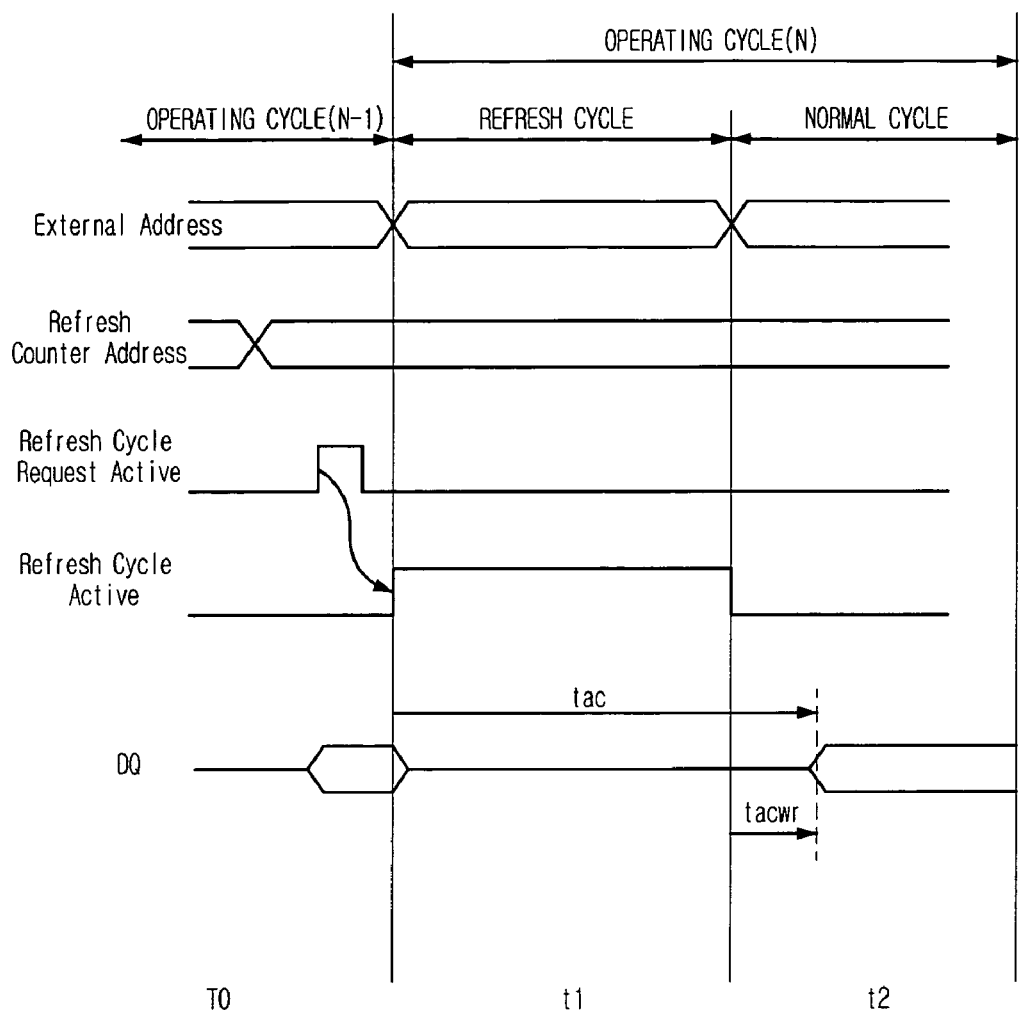
FIG. 4 is another timing diagram depicting an operation of the conventional SRAM shown in FIG. 1.
Figure 5:
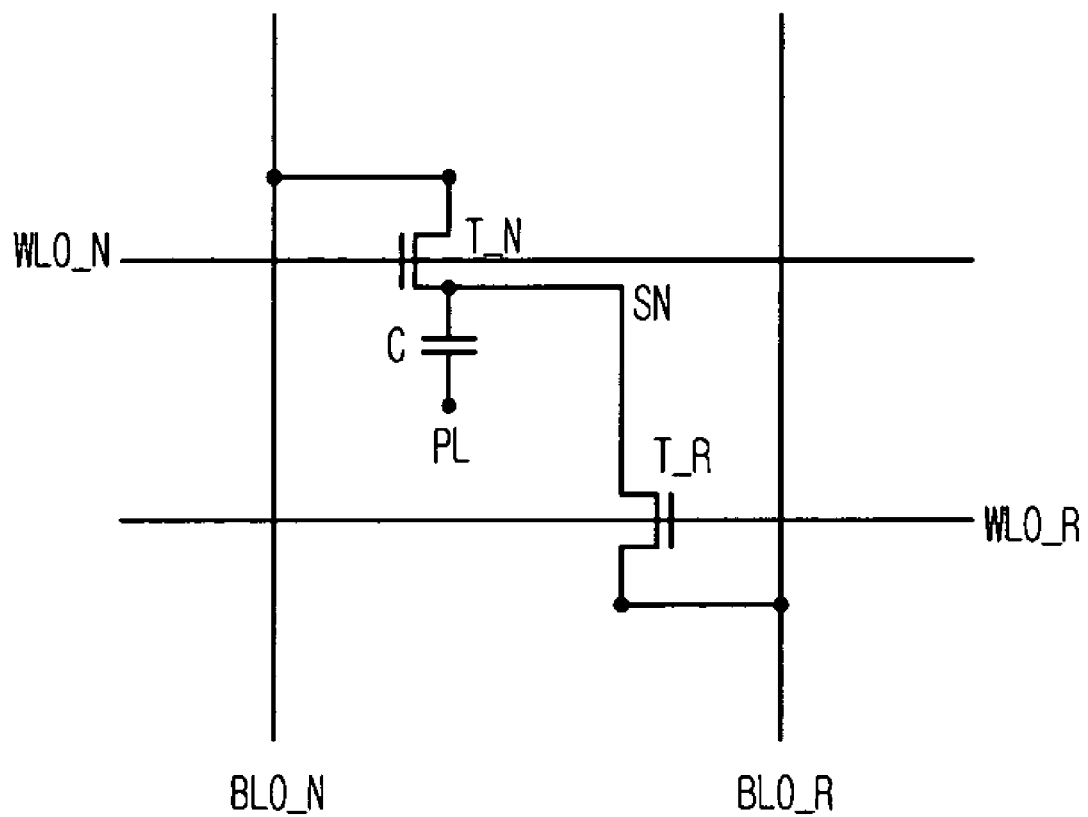
FIG. 5 is a schematic circuit diagram showing a memory cell structure of a pseudo SRAM in accordance with a preferred embodiment of the present invention.

FIG. 5 is a schematic circuit diagram showing a memory cell structure of a pseudo SRAM in accordance with a preferred embodiment of the present invention.

As shown, the memory cell of the pseudo SRAM includes a cell capacitor C, a normal accessing NMOS transistor T_N and a refresh accessing NMOS transistor T_R. A gate, a drain and a source of the normal accessing NMOS transistor T_N are respectively connected to a normal accessing word line WL0_N, a normal accessing bit line BL0_N and a storage node SN of the cell capacitor C. Similarly, a gate, a drain and a source of the refresh accessing NMOS transistor T_R are respectively connected to a refresh accessing word line WL0_R, a refresh accessing bit line BL0_R and the storage node SN of the cell capacitor C.

That is, the memory cell of the pseudo SRAM in accordance with the present invention includes two access transistors and a single cell capacitor (2T1C structure). Herein, the storage node SN of the cell capacitor C is commonly coupled to each source of the two NMOS transistors T_N and T_R. A plate line PL receives a cell plate voltage VCP (generally VDD/2).

Meanwhile, the normal accessing word line WL0_N and the normal accessing bit line BL0_N are activated for an access triggered by a normal address (external address). The refresh accessing word line WL0_R and the refresh accessing bit line BL0_R are activated for an access triggered by a refresh counter address.

Figure 6:
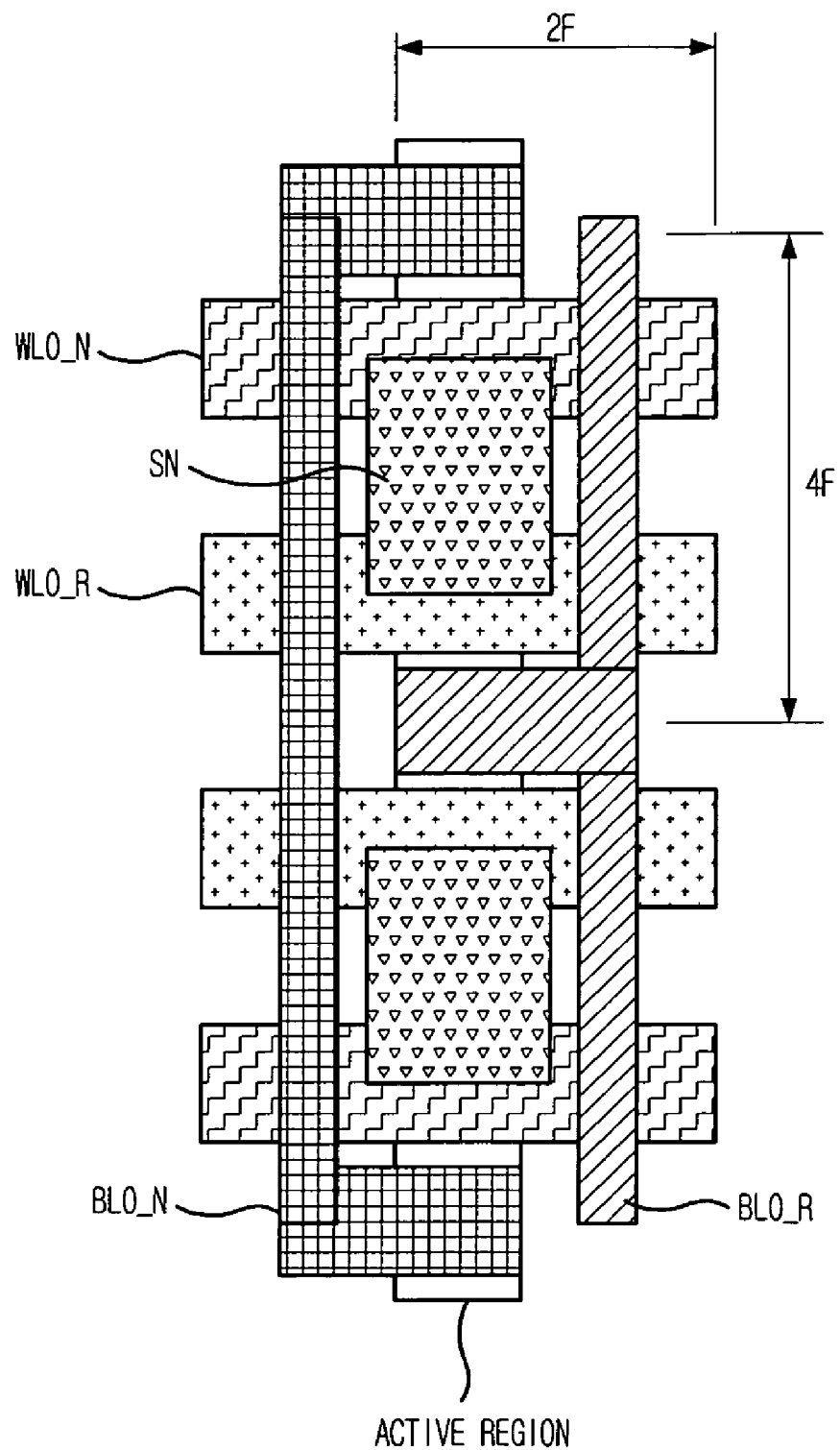
FIG. 6 is a layout depicting the pseudo SRAM shown in FIG. 5.

FIG. 6 is a layout depicting the pseudo SRAM shown in FIG. 5. Herein, two memory cells having the 2T1C structure are shown.

Referring to FIG. 6, an active region for the NMOS transistors T_N and T_R is arranged having a straight line form in the direction of the column. The word lines WL0_N and WL0_R are arranged perpendicularly to the active region. The bit lines BL0_N and BL0_R are separated from the active region and are arranged parallel to the active region. Herein, the bit lines BL0_N and BL0_R include a bit line contact for an electrical contact to drains of the NMOS transistors T_N and T_R.

Meanwhile, the memory cells which are perpendicularly adjacent to each other share the bit lines BL0_N and BL0_R and have a symmetrical structure.

By arranging memory cells as above-mentioned, a distance (in the horizontal direction) between active patterns is 2F and a distance (in the vertical direction) between the word lines WL0_N and WL0_R is 4F, wherein F is a minimum line width. Therefore, a cell size of the 2T1C structure is $8F^2$. The size of $8F^2$ has been applied to a general DRAM. Accordingly, even though the number of transistors in a memory cell is increased by 1 in comparison with the conventional pseudo SRAM, a size of the memory cell has been hardly increased. Meanwhile, it is possible that the size of the memory cell can be more decreased if a line and a space are not same.

Figure 7:
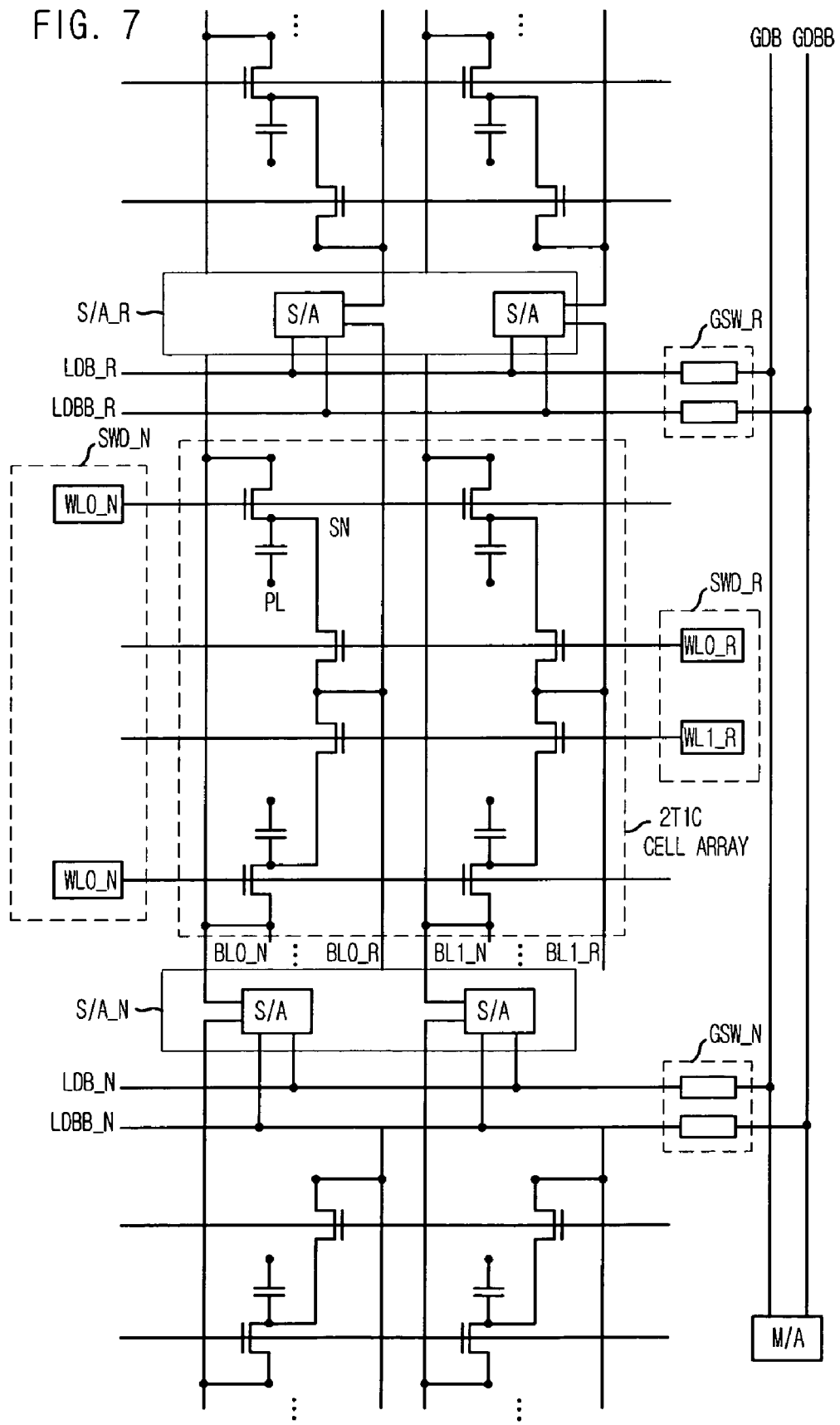
FIG. 7 is a schematic circuit diagram showing a cell array (open bit line structure) and a sensing circuit of the pseudo SRAM in accordance with the preferred embodiment of the present invention.

FIG. 7 is a schematic circuit diagram showing a cell array (open bit line structure) and a sensing circuit of the pseudo SRAM in accordance with the preferred embodiment of the present invention.

Referring to FIG. 7, the pseudo SRAM includes the cell array where the 2T1C-structed memory cells shown in FIG. 5 are arranged in the open bit line structure.

On one vertical side of a sub cell array block, a normal accessing sense amplifier array S/A_N connected to normal accessing bit lines (BL0_N, BL1_N, . . . ) is arranged. On the other side of the sub cell array block, a refresh accessing sense amplifier array S/A_R connected to refresh accessing bit lines is arranged. The normal accessing sense amplifier array S/A_N and the refresh accessing sense amplifier S/A_R are shared by adjacent sub cell array blocks.

Meanwhile, each normal accessing sense amplifier is connected to a normal accessing differential local data bus LDB_N and LDBB_N. The normal accessing differential local data bus LDB_N and LDBB_N and a differential global data bus GDB and GDBB are selectively connected by a global switch GSW_N.

Similarly, each refresh accessing sense amplifier is connected to a refresh accessing differential local data bus LDB_R and LDBB_R. The refresh accessing differential local data bus LDB_R and LDBB_R and the differential global data bus GDB and GDBB are selectively connected by a global switch GSW_R. Herein, one of the global switches GSW_N and GSW_R is selectively turned on. The M/A is a main amplifier connected to the differential global data bus GDB and GDBB.

Meanwhile, on one horizontal side of the sub cell array block, a sub word line driver array SWD_N for driving the normal accessing word lines is arranged. On the other side of the sub cell array block, a sub word line driver array SWD_R for driving the refresh accessing word lines is arranged.

Figure 8:
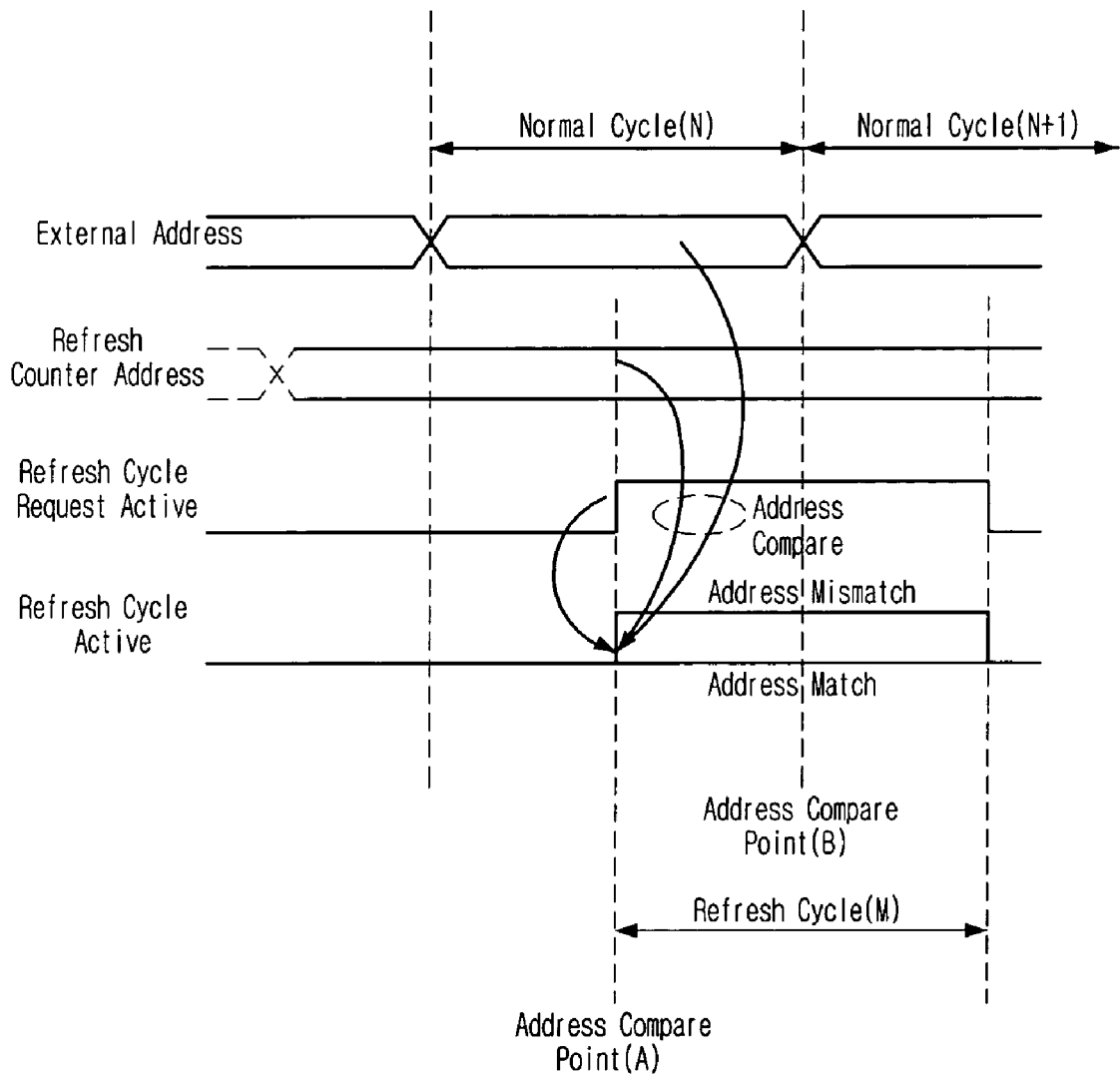
FIG. 8 is a timing diagram showing an operation of the pseudo SRAM.

FIG. 8 is a timing diagram showing an operation of the pseudo SRAM.

As above-mentioned, since there are two access paths (a normal access path and a refresh access path) to one memory cell, a normal cycle caused by an external address and a refresh cycle caused by an internal refresh counter address are independently performed. That is, while the normal cycle is performed, the refresh cycle can be also performed and vice versa.

However, in case that the external address and the refresh counter address are same, since the normal accessing word line and the refresh accessing word line corresponding to one memory cell are simultaneously activated, a process for the same address case is required.

In case of the address compare point (A), i.e., when a refresh cycle (M) is enabled in response to an activation of a refresh cycle request signal while a normal cycle (N) is performed, an external address and a refresh counter address of the corresponding normal cycle (N) are compared. If the addresses are not same, a refresh cycle signal is activated so that the refresh cycle (M) is performed. On the other hand, if the addresses are same, the refresh cycle (M) is skipped. As a matte of course, the process of the normal cycle (N) is kept regardless of the result of the address comparison. Herein, the skip of the refresh cycle (M) means that the refresh accessing word line WL_R of the cell array is inactivated.

Meanwhile, in case of the address compare point (B), when a next normal cycle (N+1) is enabled in response to a newly inputted external address while the refresh cycle (M) is performed, the newly inputted external address and the refresh counter address are compared. If the addresses are not same, the normal cycle (N+1) is performed. If the addresses are same, the normal cycle (N+1) is skipped. Needless to say, since the normal cycle and the refresh cycle are independently performed, the process of the refresh cycle (M) is kept regardless of the result of the address comparison.

Herein, the skip of the normal cycle (N+1) means that the normal accessing word line WL_N of the cell array is inactivated. However, at even this case, the access corresponding to the normal cycle (N+1) should be performed. Therefore, by using the refresh accessing bit line BL_R and the refresh accessing global switch GSW_R, the access to a memory cell corresponding to the normal cycle (N+1) is performed.

Figure 9:
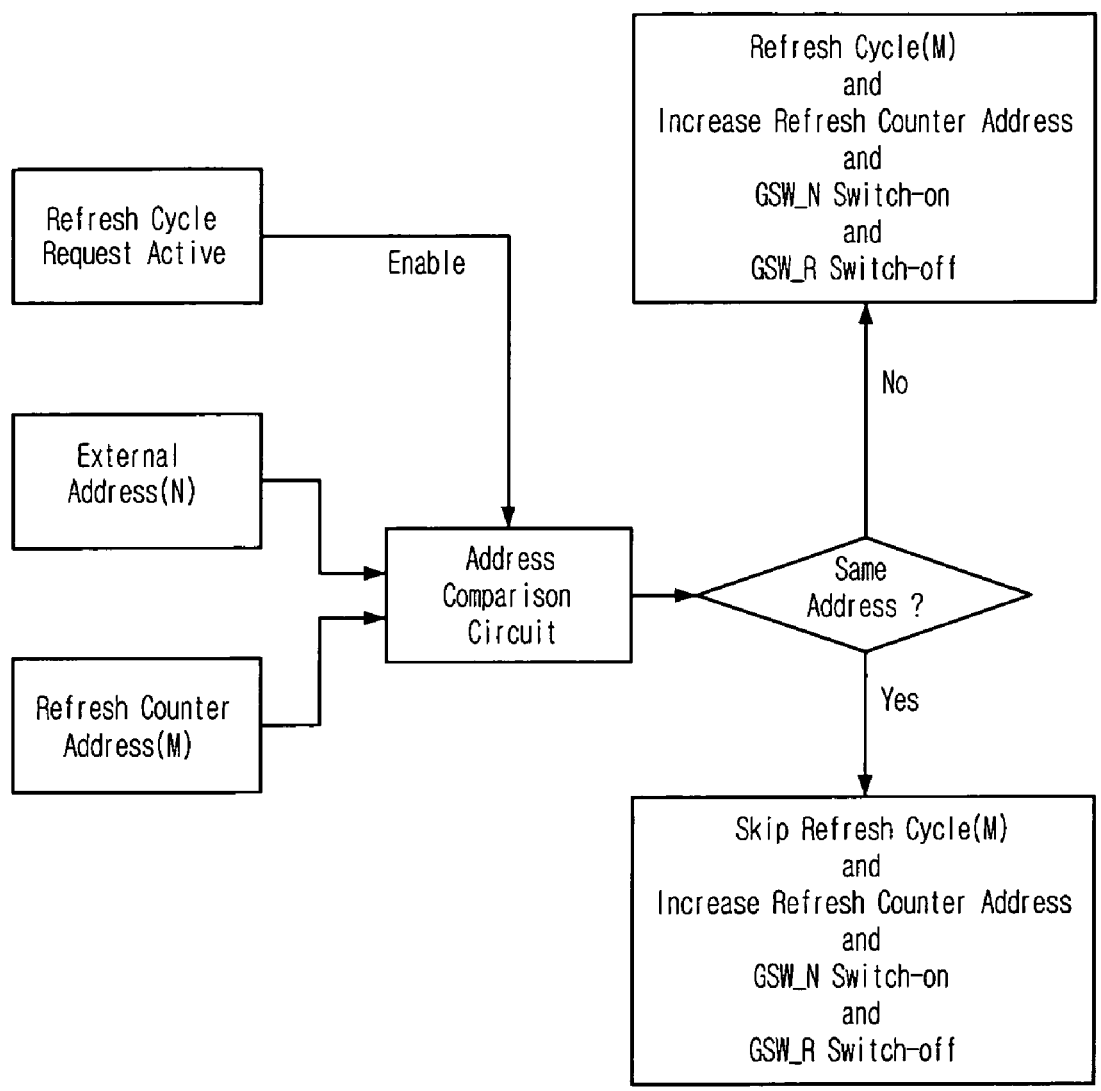
FIG. 9 is a flow chart showing the operation in case that the normal cycle is performed before the refresh cycle.
Figure 10:
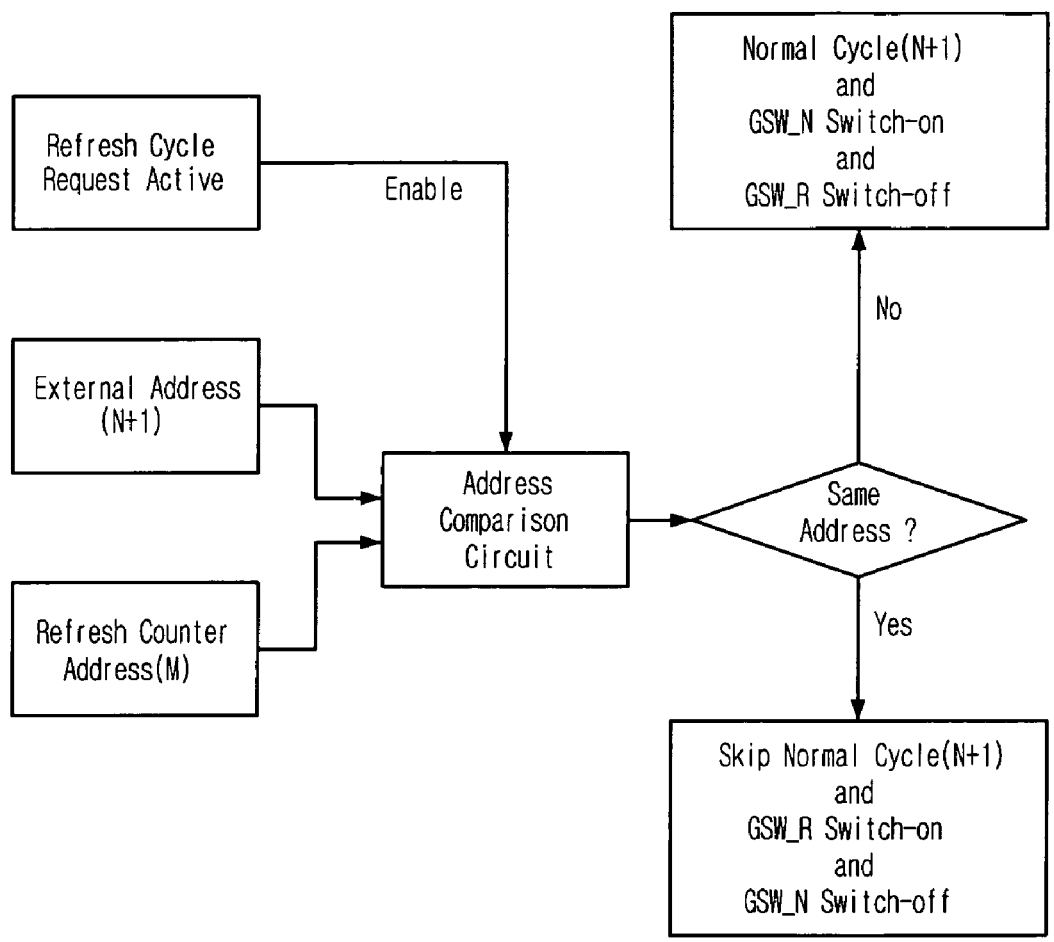
FIG. 10 is a flow chart showing the operation in case that the normal cycle is performed after the refresh cycle.

The above-mentioned operations are displayed in graph in FIGS. 9 and 10.

FIG. 9 is a flow chart showing the operation in case that the normal cycle is performed before the refresh cycle.

Referring to FIG. 9, if the refresh cycle request signal is activated while the normal cycle (N) is performed, an address comparison circuit compares an external address (N) of the corresponding normal cycle (N) with a current refresh counter address (M).

If the two addresses are same, i.e., if the external address (N) is same to the refresh counter address (M), the corresponding refresh cycle (M) is skipped and the refresh counter address is increased by 1 (M+1). At this time, the normal accessing global switch GSW_N normally keeps a turned on state and the refresh accessing global switch GSW_R also keeps a turned off state. That is, in this case, the normal cycle (N) substitutes for the corresponding refresh cycle (M).

Meanwhile, in case that the two addresses are not same (the two addresses are not same in most cases), the refresh cycle (M) corresponding to the corresponding refresh counter address is normally performed and the refresh counter address is increased by 1 (M+1). At this time, the normal accessing global switch GSW_N normally keeps a turned on state and the refresh accessing global switch GSW_R also keeps a turned off state. That is, in this case, the normal cycle (N) and the refresh cycle (M) are independently performed in parallel.

FIG. 10 is a flow chart showing the operation in case that the normal cycle is performed after the refresh cycle.

Referring to FIG. 10, in case that a new normal cycle (N+1) is requested according to a newly inputted external address (N+1), if an activation state of the refresh request signal corresponding to the refresh cycle (M) is valid, the address comparison circuit compares the external address (N+1) with the refresh counter address (M).

If the two addresses are same, i.e., if the external address (N+1) and the refresh counter address (M) are same, the corresponding normal cycle (N+1) is skipped and the access path corresponding to the corresponding refresh cycle (M) is opened to substitute for the access corresponding to the corresponding normal cycle (N+1). That is, the normal accessing global switch GSW_N is turned off and the refresh accessing global switch GSW_R is turned on.

Meanwhile, in case that the two addresses are not same (the two addresses are not same in most cases), the normal cycle (N+1) corresponding to the corresponding external address (N+1) is normally performed. At this time, the normal accessing global switch GSW_N normally keeps a turned on state and the refresh accessing global switch GSW_R also normally keeps a turned off state. That is, in this case, the normal cycle (N+1) and the refresh cycle (M) are independently performed in parallel.

Although the normal accessing transistor and the refresh accessing transistor are embodied with an NMOS transistor in accordance with the preferred embodiment of the present invention, the normal accessing transistor and the refresh accessing transistor can be embodied with another type of transistor, e.g., a PMOS transistor.

Also, although the cell array is arranged in the open bit line structure because the open bit line structure is advantageous for reducing a size of the 2T1C structured memory cell, the cell array can also be arranged in the folded bit line structure.

Further, although the differential type of the local data bus and the global data bus is applied for the preferred embodiment of the present invention, the type of a data bus is irrelevant to the present invention.

As above-mentioned, in accordance with the preferred embodiment of the present invention, by using the 2T1C structured memory cell, a normal access path and a refresh access path are provided to one memory cell. Therefore, a normal cycle triggered by an external address and a refresh cycle triggered by an internal refresh counter address can be independently performed in parallel. Accordingly, an access time increase due to the refresh operation can be prevented. As a result, an operational speed of the pseudo SRAM can be improved.

Further, since the 2T1C structured memory cell and the conventional 1T1C structured memory cell have nearly the same size, the mass production of the pseudo SRAM can be secured.

The present application contains subject matter related to Korean patent application No. 2005-0027411 and 2006-0027586, filed in the Korean Patent Office on, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A unit memory cell for use in a pseudo static random access memory (SRAM), comprising:
   a cell capacitor;
   a normal accessing transistor whose gate, drain and source are respectively connected to a normal accessing word line, a normal accessing bit line and a storage node of the cell capacitor; and
   a refresh accessing transistor whose gate, drain and source are respectively connected to a refresh accessing word line, a refresh accessing bit line and the storage node of the cell capacitor.

2. The unit memory cell as recited in claim 1, wherein each of the normal accessing transistor and the refresh accessing transistor is an n-type metal oxide semiconductor (NMOS) transistor.

3. A pseudo SRAM, comprising:
   a memory cell array block where a plurality of normal accessing bit lines and refresh accessing bit lines and a plurality of normal accessing word lines and refresh accessing word lines are arranged in pairs, wherein the memory cell array block includes a unit memory cell, the unit memory cell including:
   a cell capacitor;
   a normal accessing transistor for selectively connecting the cell capacitor to the normal accessing bit line under the control of the normal accessing word line; and
   a refresh accessing transistor for selectively connecting the cell capacitor to the refresh accessing bit lines under the control of the refresh accessing word line;
   a normal accessing sense amplifier array block which is arranged on one column side of the memory cell array block and is connected to the normal accessing bit line;
   a refresh accessing sense amplifier array block which is arranged on the other column side of the memory cell array block and is connected to the refresh accessing bit line;
   a normal accessing local data bus connected to the normal accessing sense amplifier array block; and
   a refresh accessing local data bus connected to the refresh accessing sense amplifier array block.

4. The pseudo SRAM as recited in claim 3, wherein each of the normal accessing transistor and the refresh accessing transistor is an NMOS transistor.

5. The pseudo SRAM as recited in claim 3, further comprising:
   a refresh counting unit for internally generating a refresh address;
   an address comparison unit for comparing a normal address externally inputted in response to a refresh cycle request signal with the refresh address;
   a first switch unit for selectively connecting the normal accessing local data bus to a global data bus in response to an output of the address comparison unit; and
   a second switch unit for selectively connecting the refresh accessing local data bus to the global data bus in response to the output of the address comparison unit.

6. The pseudo SRAM as recited in claim 5, further comprising:
   a normal accessing sub word line driver array block arranged on one row side of the sub cell array block for driving the normal accessing word line; and
   a refresh accessing sub word line driver array block arranged on the other row side of the sub cell array block for driving the refresh accessing word line.

7. The pseudo SRAM as recited in claim 5, wherein in case that the refresh cycle request signal is changed from an inactivation state to an activation state, if the normal address and the refresh address are same, the refresh accessing word line corresponding to the refresh address is disabled; the refresh address is increased by 1; the first switch unit keeps a turned on state; and the second switch unit keeps a turned off state.

8. The pseudo SRAM as recited in claim 5, wherein in case that a new normal address is inputted while the refresh cycle request signal is activated, if the normal address and the refresh address are same, the normal accessing word line corresponding to the normal address is disabled; the refresh accessing word line corresponding to the refresh address is enabled; the first switch unit is turned off; and the second switch unit if turned on.

* * * * *